US008307666B2

(12) United States Patent
Woidtke et al.

(10) Patent No.: US 8,307,666 B2
(45) Date of Patent: Nov. 13, 2012

(54) METHODS AND APPARATUS FOR PROVIDING ROTATIONAL MOVEMENT AND THERMAL STABILITY TO A COOLED SAMPLE

(75) Inventors: Alex Woidtke, Bozeman, MT (US); Peter B. Sellin, Bozeman, MT (US); Charles Thiel, Bozeman, MT (US); Calvin C. Harrington, Bozeman, MT (US)

(73) Assignee: S2 Corporation, Bozeman, MT (US)

( * ) Notice: Subject to any disclaimer, the term of this patent is extended or adjusted under 35 U.S.C. 154(b) by 408 days.

(21) Appl. No.: 12/749,036

(22) Filed: Mar. 29, 2010

(65) Prior Publication Data

US 2010/0242503 A1 Sep. 30, 2010

Related U.S. Application Data

(63) Continuation-in-part of application No. 12/461,529, filed on Aug. 14, 2009, and a continuation-in-part of application No. 12/621,306, filed on Nov. 18, 2009.

(60) Provisional application No. 61/202,690, filed on Mar. 27, 2009.

(51) Int. Cl.
*F25B 19/00* (2006.01)

(52) U.S. Cl. .............................. 62/51.1; 62/55.5; 62/383

(58) Field of Classification Search .................. 62/51.1, 62/48.3, 45, 55.5, 383; 165/135, 185; 248/636, 248/638; 312/118, 234; 277/312, 319; 29/890.035, 29/898.11
See application file for complete search history.

(56) References Cited

U.S. PATENT DOCUMENTS

| | | | |
|---|---|---|---|
| 3,721,101 A * | 3/1973 | Sheppard et al. ................. 62/56 |
| 3,894,403 A | 7/1975 | Longsworth |
| 4,161,747 A | 7/1979 | Jennings et al. |
| 4,394,819 A | 7/1983 | Averill |
| 4,438,632 A * | 3/1984 | Lessard et al. ................. 62/55.5 |
| 4,763,483 A * | 8/1988 | Olsen ............................. 62/55.5 |
| 4,854,131 A | 8/1989 | Sakitani et al. |
| 4,869,068 A | 9/1989 | Van Vloten |
| 5,077,637 A | 12/1991 | Martorana et al. |
| 5,129,232 A | 7/1992 | Minas et al. |
| 5,317,879 A | 6/1994 | Goldberg et al. |
| 5,327,733 A | 7/1994 | Boolchand et al. |
| 5,782,096 A * | 7/1998 | Bartlett et al. ................. 62/55.5 |
| 6,516,281 B1 * | 2/2003 | Wellstood et al. ............ 702/130 |
| 7,074,364 B2 * | 7/2006 | Jahn et al. ........................ 422/62 |
| 2002/0042145 A1 * | 4/2002 | Forsberg ....................... 436/165 |
| 2004/0108067 A1 * | 6/2004 | Fischione et al. ........ 156/345.38 |
| 2005/0188705 A1 * | 9/2005 | Jones et al. ....................... 62/86 |

(Continued)

*Primary Examiner* — Mohammad Ali
(74) *Attorney, Agent, or Firm* — McDermott Will & Emery LLP

(57) ABSTRACT

A method of rotating a sample for use in a cryocooler, having the steps of mounting a sample in a sample mounting apparatus, the apparatus comprising a housing having an outer wall surface, an inner wall surface, a mount attached to the inner wall surface for supporting the sample, and a motor for rotating the sample, and an exchange gas to provide thermal communication between the moving sample and the inner housing surfaces; sealing the housing by applying a sealant to adjoining parts of the housing such that the joints are air tight; evacuating the housing; adding an inert gas to the housing; sealing the inert gas in the housing; attaching the outer wall surface of the housing to a cryocooler; and rotating the sample by engaging the motor. Also disclosed is a cryogenic apparatus having a sample holder; a cryo-cooler; a thermal link connecting the sample holder and the cryo-cooler; and a motor attached to the sample holder for rotating a sample.

16 Claims, 9 Drawing Sheets

U.S. PATENT DOCUMENTS

| | | | |
|---|---|---|---|
| 2005/0223716 A1* | 10/2005 | Arav | 62/62 |
| 2006/0147248 A1* | 7/2006 | Fukui et al. | 401/99 |
| 2007/0098699 A1* | 5/2007 | Rudd | 424/93.7 |
| 2007/0231872 A1* | 10/2007 | Butters et al. | 435/173.1 |
| 2008/0241404 A1* | 10/2008 | Allaman et al. | 427/333 |
| 2010/0050661 A1 | 3/2010 | Snow et al. | |
| 2010/0127148 A1 | 5/2010 | Woidtke et al. | |

* cited by examiner

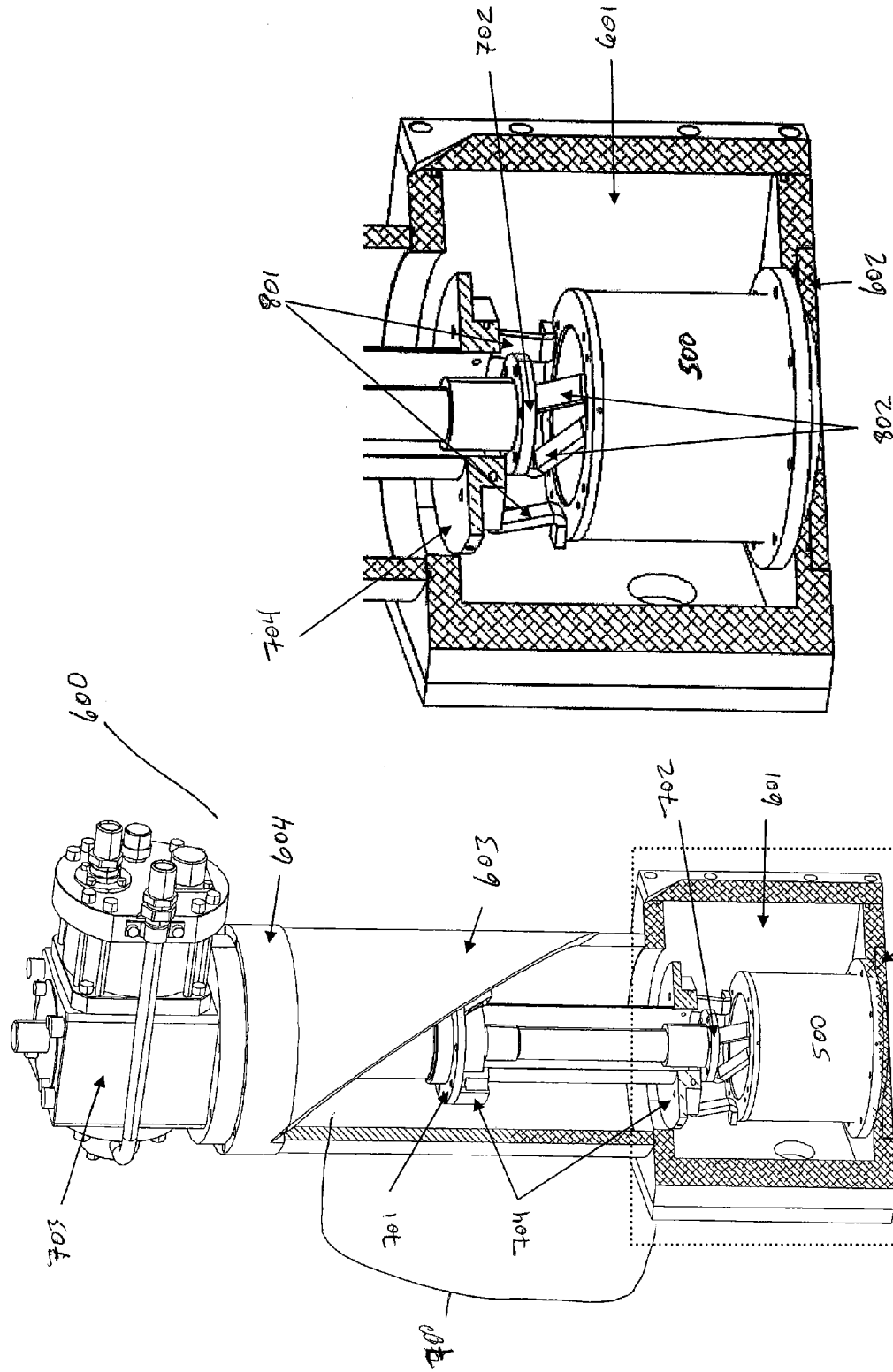

METHODS AND APPARATUS FOR PROVIDING ROTATIONAL MOVEMENT AND THERMAL STABILITY TO A COOLED SAMPLE

CROSS REFERENCE TO PROVISIONAL APPLICATION AND RELATED APPLICATIONS

This application is based upon and claims the benefit of priority from Provisional U.S. Patent Application 61/202,690 filed on Mar. 27, 2009, the entire contents of which are incorporated by reference herein.

This application is a continuation in part of U.S. application Ser. No. 12/461,529 filed Aug. 14, 2009, entitled "APPARATUS AND METHODS FOR IMPROVING VIBRATION ISOLATION, THERMAL DAMPENING, AND OPTICAL ACCESS IN CRYOGENIC REFRIGERATORS", the disclosure of which is entirely incorporated herein by reference.

This application is also a continuation in part of U.S. application Ser. No. 12/621,306 filed Nov. 18, 2009, entitled "VIBRATION REDUCING SAMPLE MOUNT WITH THERMAL COUPLING", the disclosure of which is entirely incorporated herein by reference.

GOVERNMENT INTEREST

This invention was made with government support under Grant No. DASG60-03-C-0075, awarded by the US ARMY SPACE & MISSILE DEFENSE COMMAND. The Government has certain rights in the invention.

BACKGROUND

1. Field of the Disclosure

This disclosure relates to low temperature cooling devices. Particularly, this disclosure relates to a cryogenic apparatus having a motor and method for using the motor for providing rotational freedom and movement to a mounted sample attached to a cold finger in a cryogenic cooler.

2. Description of the Related Art

Cryogen-free refrigerators, also called cryo-coolers or cryostats, utilize a closed-cycle circulating refrigerant (often helium gas) to extract heat from a cold finger at cryogenic temperatures and pump it away to a heat exchanger. The cold finger is a metallic heat sink which is actively cooled by the refrigerant. The cold finger can be temperature controlled and serves as a mounting point for an object. The main goal of attaching the object to the cold finger is that the object will be cooled, so that a user can use or make measurements on a cold sample. Objects to be cooled can include semiconductor devices, detectors, mechanisms, material samples, or any other objects that require fixed, cryogenic temperature operation.

In conventional cryo-coolers, measurements on mounted samples using a laser are performed by movement of a laser beam on a stationary object. However, this method has drawbacks, such as difficult alignment of optical beams. An ideal solution to this problem would be to keep the laser motionless, while rotating the mounted sample that is kept in thermal communication with its cryogenic surroundings.

In order to provide rotational freedom and movement to a mounted sample attached to a cold finger in a cryogenic cooler, the present disclosure describes a miniature cryogenic motor added inside a cryogenic apparatus such as a gas exchange box (GXB) for spinning a sample and thermally maintaining it at cryogenic temperatures.

SUMMARY

To overcome the above mentioned problems, this disclosure identifies a method of rotating a sample for use in a cryocooler comprising mounting a sample in a sample mounting apparatus, the apparatus comprising a housing having an outer wall surface, an inner wall surface, a mount attached to the inner wall surface for supporting the sample, and a motor for rotating the sample, and an exchange gas to provide thermal communication between the moving sample and the inner housing surfaces; sealing the housing by applying a sealant to adjoining parts of the housing such that the joints between the parts do not allow gas to enter or leave the housing; evacuating the housing; adding an inert gas to the housing; sealing the inert gas in the housing; attaching the outer wall surface of the housing to a cryocooler; and rotating the sample by engaging the motor.

Also disclosed is a cryogenic apparatus comprising a sample holder; a cryo-cooler; a thermal link connecting the sample holder and the cryo-cooler; and a motor attached to the sample holder for rotating a sample.

Additional advantages and other features of the present disclosure will be set forth in part in the description which follows and in part will become apparent to those having ordinary skill in the art upon examination of the following or may be learned from the practice of the disclosure. The advantages of the disclosure may be realized and obtained as particularly pointed out in the appended claims.

As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

FIGS. 8A-B are cutaway views of a vibration assembly and cryo-cooler according to an embodiment of the present disclosure.

DETAILED DESCRIPTION OF ILLUSTRATIVE EMBODIMENTS

Figure 1:
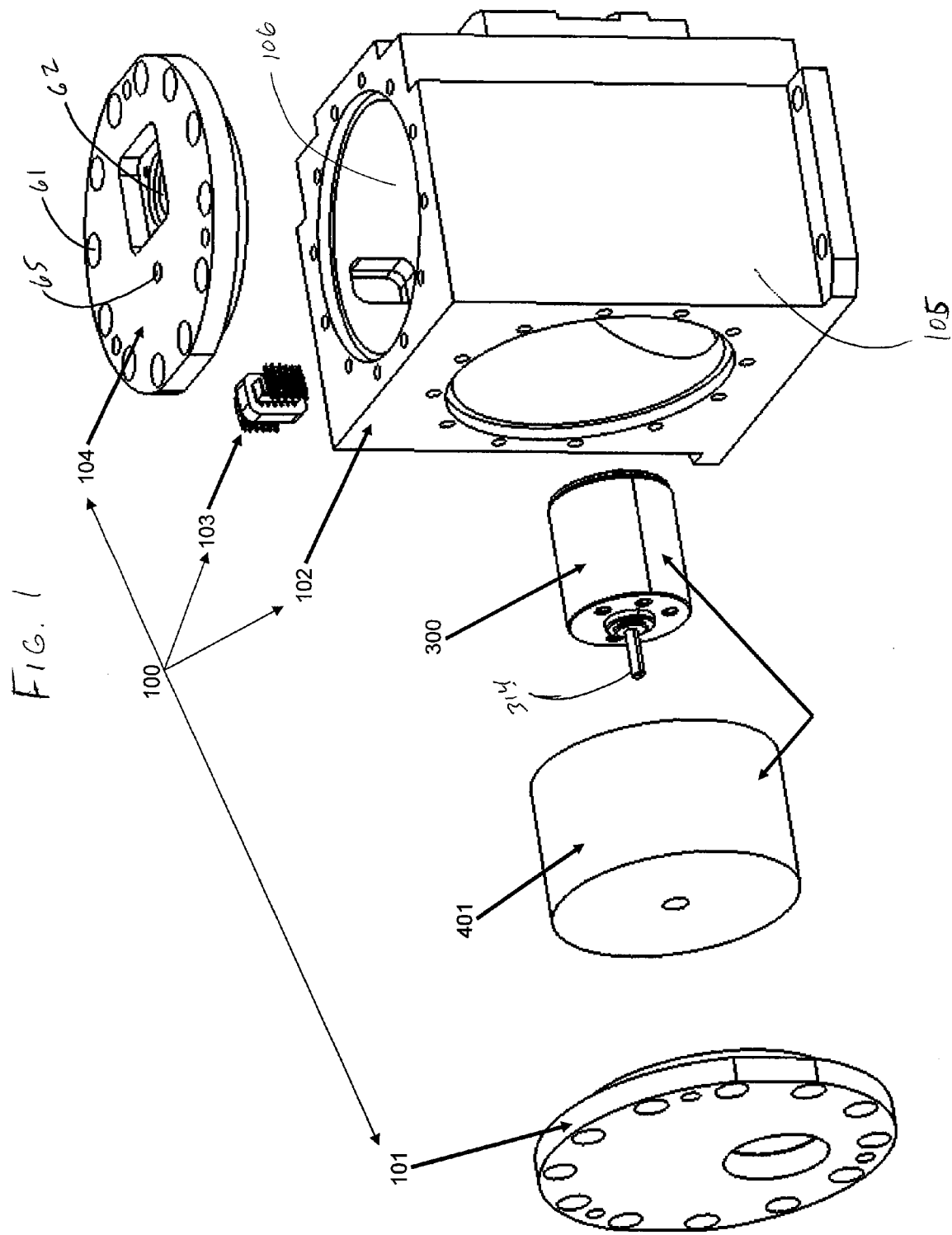
FIG. 1 is an expanded view of a sample mounting apparatus according to one embodiment of the present disclosure.

The drawing figures depict one or more implementations in accord with the present teachings, by way of example only, not by way of limitation. In the figures, like reference numerals refer to the same or similar elements.

The present disclosure is directed toward a method of rotating a sample for use in a cryo-cooler comprising mounting a sample in a sample mounting apparatus. As shown in FIGS. 1-4, the sample 401, 402 is mounted in the sample mounting apparatus 100, which comprises a housing 102 having an outer wall surface 105 for connecting to the cryo-cooler (not shown), and an inner wall surface 106, a mount 314 attached to the inner wall surface 106 of the housing 102 for supporting a sample 401 or 402 and substantially preventing vibrations from being transferred to the sample 401 or 402 from the cryo-cooler.

the housing 102 is sealed by applying a sealant to adjoining parts of the housing such that the joints between the parts do not allow gas to enter or leave the housing 102. As is shown in FIG. 1, the top vacuum seal plate 104 and the side vacuum seal plate 101 are sealed to the main body of the housing 102.

The housing 102 is then evacuated by a single fill/drain tube 90 (FIG. 6) soldered in place into the fill and drain port 65, which allows an access point that can be used to fill the apparatus 100 with inert gas. The drain tube 90 can then be crimped to seal the inert gas in the housing 102. An outer wall surface of the housing 105 is then attached to a cryocooler 700 (see, FIG. 8A), wherein the sample 401, 402 is then rotated by engaging the motor 200, 300.

In one embodiment as shown in FIG. 1, a conventional motor 300 is used to rotate sample 401. Examples of a conventional motor are model Nos. AM_1524 and AM_1020 (Dr. Fritz Faulhaber GmbH & Co. KG, Schönaich, Germany). In the present method, a motor 300 capable of operating at cryogenic temperatures ideally satisfies multiple design parameters including consistency of rotation, operation at cryogenic temperatures of ~4 K, small size, and large sample capability. The available sample space in many very low temperature 4 K cryostats is limited. For example, in one cryostat, the space is 2.375 in. diameter by 2.5 in. long. Differential contraction of all the different employed materials must be balanced for cooling from 300 K environments to 4 K or lower. Fine tolerances such as gaps between cooled sample surfaces 401 or 402 and copper walls of the housing 102 have been optimized to maximize conductive transport, while allowing slop for any remaining unbalanced, differential thermal contraction.

Bearing lubrication methods must be able to avoid freezing or seizing at cryogenic temperatures. Any known lubricant capable of operating at cryogenic temperatures is acceptable. It is also possible to use no lubricant for light sample loads when the bearing surfaces are clean, but not so perfectly clean as to promote undesirable cold welding and seizing. Electrical feedthroughs 103 are needed to control the motor 300 that needs to be vacuum sealed, electrically conductive, and have low wire resistance in cooled areas where minimal loads from resistive heating can also be a problem.

Figure 2:
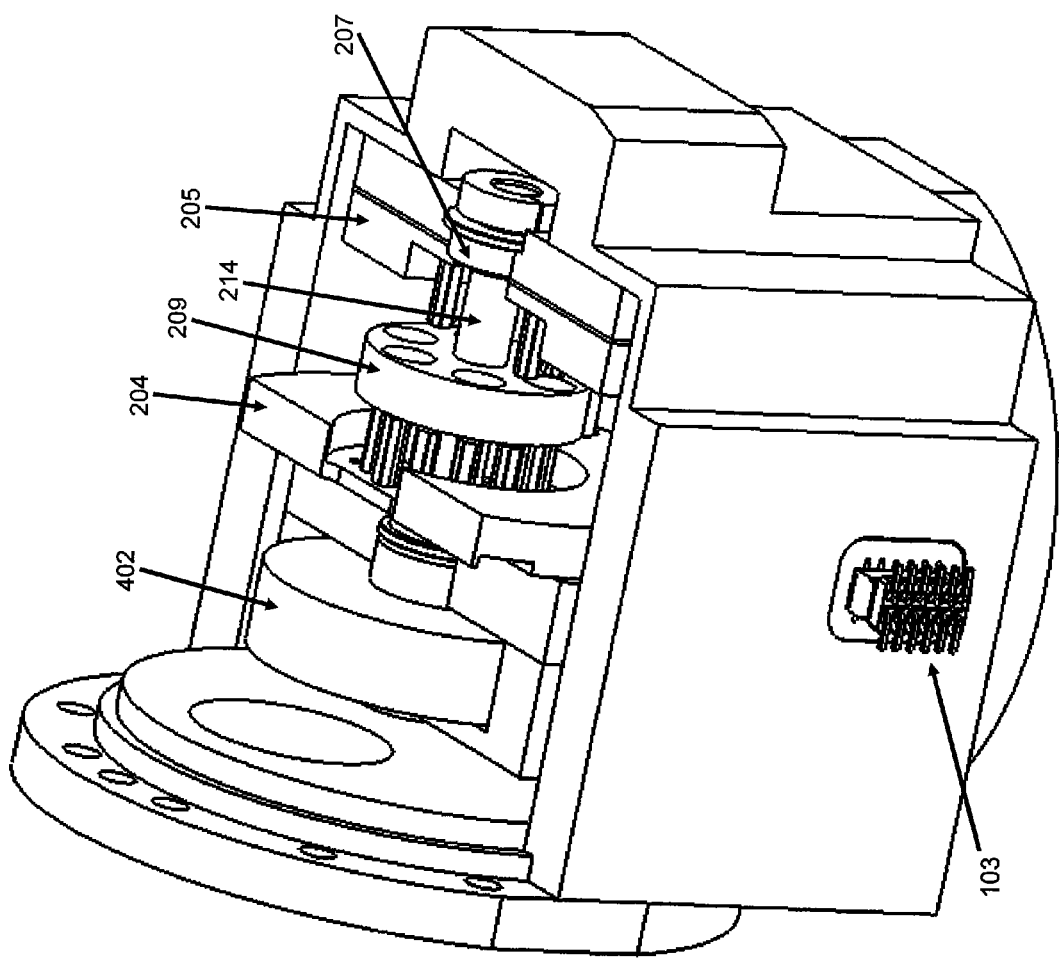
FIG. 2 is a top perspective view of an apparatus containing a motor according to another embodiment of the present disclosure.
Figure 3:
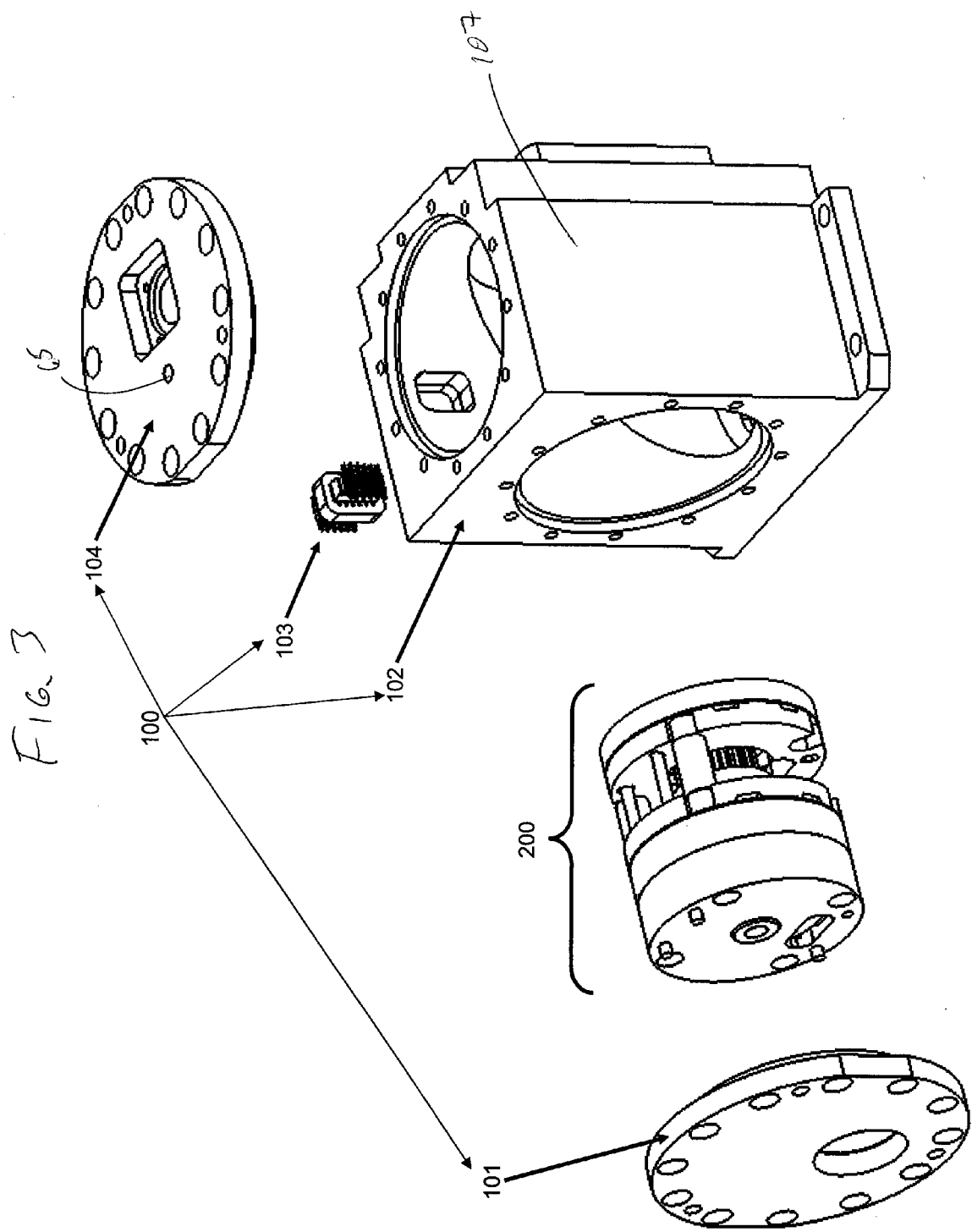
FIG. 3 is an expanded view of the apparatus according to another embodiment of the present disclosure.
Figure 4:
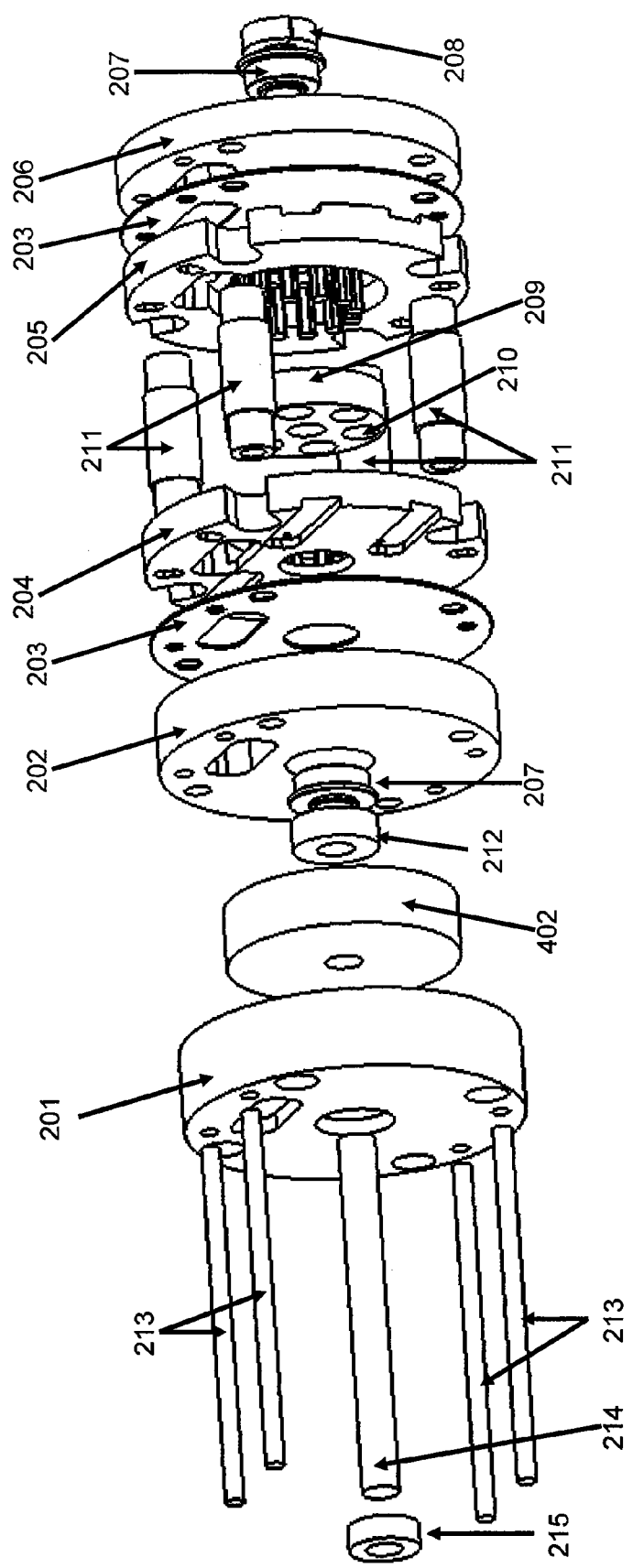
FIG. 4 is a view of a cryogenic motor according to another embodiment of the present disclosure.

In another embodiment, a custom motor 200 designed for cryogenic conditions is shown in FIGS. 2-4. As with any electrical motor, this embodiment has a first and second stator 204, 205 to provide rotational energy. The stators 204, 205 are mounted stationary and hold electrical coils which produce a rotating magnetic field pattern. The rotor 209 which is mounted to the motor shaft 214 is pressed on with magnets (not shown) pressed into it. The motor shaft 214, which serves as a mount, is supported by a bearing 207, which in turn is supported by the center motor support 202 and rear motor support 206. The motor shaft 214, in addition to supporting the sample 402, supports the shaft clamp 208, the rotor 209, and the press-on collars 212, 215, which are located at each end of the sample. The motor 200 also comprises magnetic shielding 203 placed between the first stator 204 and a center motor support 202; and between a second stator 205 and rear motor support 206. The stators 204, 205 are connected with stator spacers 211 which fit in grooves in the stators.

FIG. 3 shows one embodiment having a sample that is a 20 mm diameter by 5 mm thick disc. In this embodiment, the sample rotates reliably at 600 rpm. Higher rotational velocities are achievable, however limited by the torque of the motor, which could require a longer ramp up time to the desired rotational speed as limited by the motor.

The moving magnetic fields used in the motor are weakened when eddy currents are induced in nearby copper or other conductive materials, which produces an opposing magnetic field. The countering field weakens the magnetic fields used by the motor's stator(s) and rotor(s), which decreases the rotating torque of the motor.

As a motor gets colder the resistance of copper decreases, which enables eddy current electrons to move more easily and produce stronger countering magnetic fields that weaken the motor still further, possibly so much as to have inadequate torque for operation. Ideally, the materials used in and nearby the motor should be non-conductive and non-magnetic; otherwise, less conducting materials are preferred to more conductive ones.

As such, problems with stray electromagnetic effects are reduced with the proper choice of base materials. In one embodiment, motor parts are constructed out of aluminum alloy #6061, which is more resistive than high purity copper. Base materials have been metals however many materials could work as base materials such as plastics, composites, or ceramics. In other embodiments, motors made of non-conducting materials, insulating materials, or non-magnetic materials are used to avoid the problems with electromagnetic effects.

Both the copper and aluminum motor also retain magnetic shielding for the stators, which reduces eddy currents by redirecting the stray magnetic flux away from the nearby surfaces where eddy currents may be generated. The shielding also minimizes the magnetic field effects seen by the spinning sample.

Three principal factors for tolerancing were identified for manufacturing a sample 401 or 402 so that the sample 401 or 402 will spin evenly without kinetic disturbance during testing. Longitudinal motion along the axis of the custom motor 200 or conventional motor 300 results in a Doppler shift error in optical testing along that axis, while pure transverse motion is not of direct concern unless it induces large vibrations in the assembly.

An important factor is that the sample 401 or 402 be mounted perpendicular to the axis of rotation, which runs along the linear axis of the shaft 214, 314. If it is mounted with a residual tilt, the edge of the sample 401 or 402 will be seen to wobble once per rotation, and an equivalent sinusoidal longitudinal oscillation as seen from the perspective of the optical beam. As an example, a sample 402 that is mounted 5 arc-minutes off perpendicular to the shaft 214, 314 will correspond to a maximum displacement of +/−15 μm. This displacement can cause a worst case Doppler shift of +/−1.1 kHz.

Bearings are used for two important purposes in the motor 200. They are used to (1) allow for rotational movement and (2) to isolate the sample from vibrations, such as those created by a cold head. All versions of the motor 200 have ⅛ in. stainless steel shafts 214 supported by bearings 207. These have been mainly used for ease of finding compatible bearings. Other sizes can be used and is not limited to ⅛ in. shaft size. All shafts have been precision ground although this is not required. Precision grinding will allow for tight straightness and roundness tolerances.

In one embodiment, a motor 200 has a large glass sealed electrical feedthrough 103, while other embodiments use two surface mount miniature connectors, both having 12 pins that are mounted to opposite sides of a circuit board (not shown), which allows 12 different electrical feed through connections.

The motor 200 can be used with the gas exchange box such as that described in U.S. patent application Ser. No. 12/621,306. In one embodiment as shown in FIG. 3, the housing 102 comprises a main body 107 and a removable end plate 101, and the endplate 101 is sealed to the main body 107 with a sealant that can create an air-tight seal. Examples of sealants are indium, epoxy, and solder. An inert gas sealed inside the housing 102 may be any inert gas suitable for heat transfer in low temperature applications. In certain embodiments, the inert gas is helium. In other embodiments, nitrogen is used as the inert gas.

Figure 5:
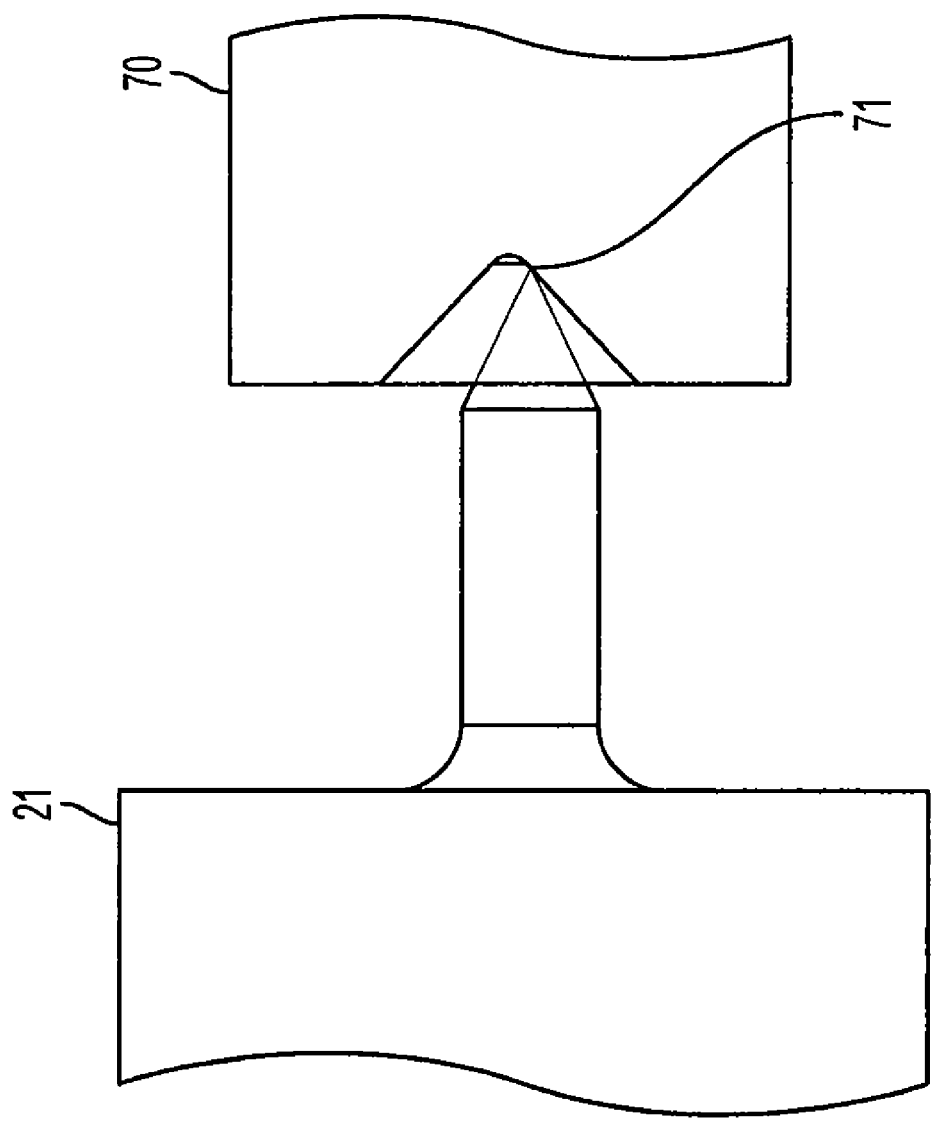
FIG. 5 is a side view of a shaft having a point contact with a Vee Jewel bearing according to another embodiment of the present disclosure.

Alternatively, as shown in FIG. 5, the vibration reducing connector comprises a conventional jewel bearing 70 for rotatably mounting a shaft 21 to the inner wall surface 106 in FIG. 1.

Figure 6:
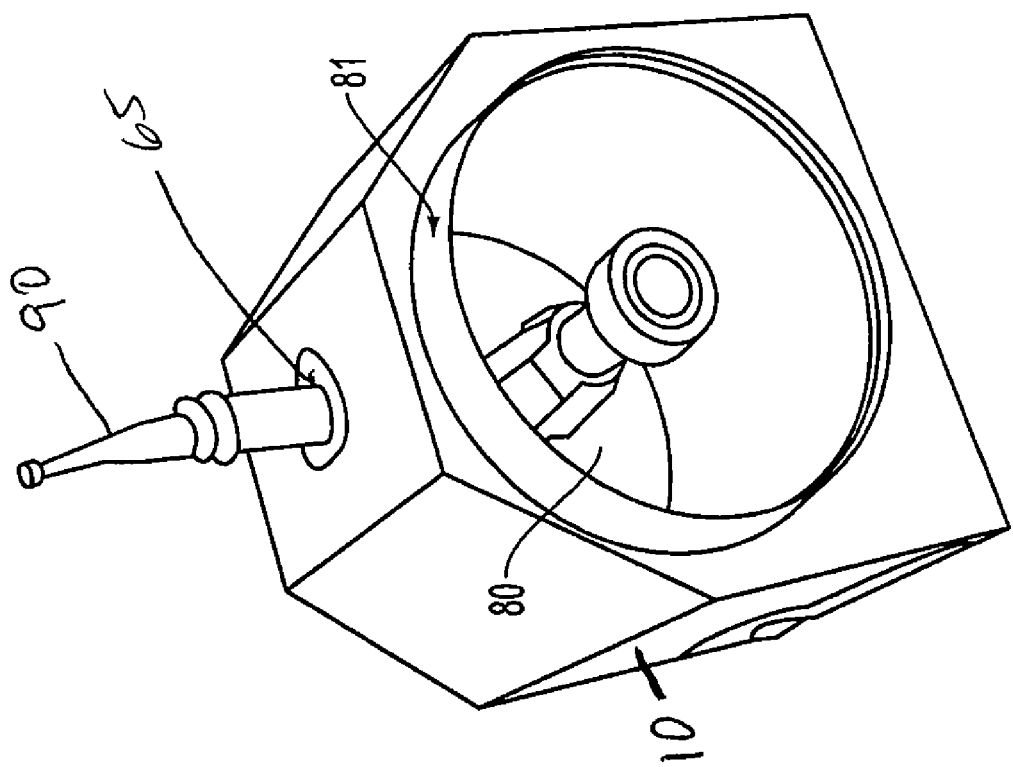
FIG. 6 is a top perspective view of a housing sealed with epoxy according to another embodiment of the present disclosure.

In another embodiment of the present disclosure, such as shown in FIG. 6, the housing 10 further comprises a transparent window portion 80 for optical access to the sample. However, the window portion 80 may also be used with the housing 102 as shown in FIGS. 1 and 3. The window portion 80 can be sealed to the housing 102 with any known sealant suitable for low temperature operations. In some embodiments, an indium seal, epoxy seal or glue is used for sealing the window portion 80. Each of these seal materials have their advantages and drawbacks. For example, solder can be hard to apply to large perimeter seals due to the elevated working temperature. Indium can be difficult to work with due to pressure requirements needed for an effective pressed indium seal. Epoxy should only be used in very thin layers, otherwise shear driven cracking or fatigue of the base material may occur due to differential thermal expansion or contraction. In certain embodiments, the apparatus uses a mix of all three sealing options in different locations.

To prevent damage to the window 80, the housing 102 contains a housekeeper seal 81 to accommodate the differences in size of materials due to thermal expansion. Any suitable material for cold temperature applications may be used for the housing 102. One example of a suitable material is copper. Advantages of using copper include that copper is readily solderable, has high thermal conductivity, and is fairly readily machineable.

According to one embodiment of the present disclosure, the apparatus 100 is sealed with an exchange gas, such as helium trapped inside. The gas in the apparatus 100 allows cooling of the sample 401 or 402. The apparatus 100 has a flange 104 for sealing, with a purging port 61, a safety blow off valve 62 in case of over-pressurization, a fill/drain tube 90 (as shown in FIG. 6) from which to perform the final fill and sealing of the apparatus 100 via the fill/drain port 65, a basis for mounting the sample 401 or 402, and windows 80 for optical access.

The apparatus 100 is alternatively made of other materials such as aluminum, steel, brass, plastic, molded epoxy, or composite materials having sufficient thermal conductivity. Conventional housings have been sealed using a single fill/drain tube 90 soldered in place into the fill and drain port 65, which allows an access point that can be used to fill the apparatus 100 with helium, then vacuumed out, and repeated until the purity of the atmosphere inside the apparatus 100 is at a suitable level. In this manner, the purity of helium inside the apparatus 100 increases in a geometric progression after each evacuation and refilling, multiplied by a reasonable number of repetitions.

Mounting of a window 80 onto an apparatus 100 allows for optical access to a cooled sample or device with minimal birefringence created by strain from differing coefficient of thermal expansion (CTE). Various methods have been developed to allow for optical access, including seals made from epoxy, solder, or indium.

According to one embodiment, window mounting is performed with a thin mounting flange 81 that is machined into the window seat to relieve stresses induced from the housing. This rim is machined in to create a ledge for a window to sit in, thus reducing the stress and strain that occur on the window 80 while thermally cycling between about 300 K to about 4 K (see FIG. 6). This method of stress relieving is known as a housekeeper seal 81. If the metal is thick around the mounted window it will shrink down when cooled and crush the window 80. Windows smaller than 0.5 in can be mounted directly into the housing 102 often without undesired stress, but for larger diameter windows a housekeeper seal 81 is advised.

Figure 7A:
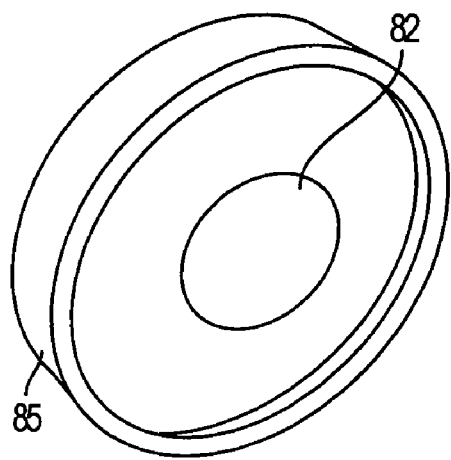
FIGS. 7A-B show a window of a housing according to another embodiment of the present disclosure.
Figure 7B:
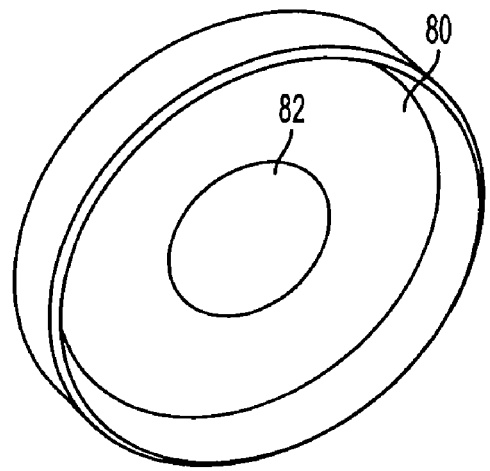

Windows can be soldered into place using a fluxless solder; residual flux may contain acids or other compounds that undesirably degrade surfaces, seals, window coatings, or delicate samples. Alternatively, as shown in FIGS. 7A-B, a thin layer of epoxy 85 is used to seal windows. The epoxy layer 85 must be of sufficient thinness in order to allow for thermal contraction forces to be small enough such that the window material is not under stress. When cooled, epoxy 85 will shrink, causing stress on the window 80 and crack it. The window optionally contains a metalized portion 82.

When sealing a window 80 in place, care is taken to make sure the epoxy layer 85 is substantially even around the whole perimeter of the window 80. One method of accomplishing this is to epoxy the window 80 in place and twist the window 80 in the mount before the epoxy cures. This will allow the epoxy to flow into all crevices and fill any imperfections therefore creating an even layer.

When using epoxy, all components should be cleaned thoroughly. The mating metal surface should be etched using some form of etching bath (such as sodium persulfate). All mating surfaces should be cleaned with an acetone wipe followed by a methanol wipe. This is to ensure no residual oils are left on the surface, and the combination of a clean etched surface will increase the strength of the epoxy bond.

In other embodiments, a cryogenic apparatus comprises a sample holder, a cryo-cooler, a thermal link connecting the sample holder and the cryo-cooler and a motor attached to the sample holder for rotating a sample. One cryogenic apparatus is shown in U.S. patent application Ser. No. 12/461,529.

In other embodiments, the apparatus comprises a nested thermally insulated structure (NTIS) serving as the sample holder. One example of the NTIS may also be found in U.S. patent application Ser. No. 12/461,529. As shown in FIGS. 8A-B, the NTIS 500 connects to a cryo-cooler 700 via the thermal links 801, 802.

The cooled components within the cryostat are held in a vacuum environment maintained by a vacuum shroud 600 as shown in FIG. 8A. The bottom vacuum housing 601 is a main housing for the NTIS 500, and supports the upper vacuum housing 603 and the coldhead 703. The vacuum plate 602 is used to access the sample mounting volume or sample chamber 500. The upper vacuum housing 603 is typically round aluminum tubing which is used to support the cryo-cooler head 703. The adapter plate 604 is made to attach to the upper vacuum housing 603 to adapt the housing to the cryo-cooler cold head 703 that is desired for use. All parts typically operate at a temperature of 300 K.

FIG. 8B shows the vacuum plate 602 connected to vacuum housing 601 via bolts that thread into tapped holes in the bottom vacuum housing 601 with counter-bored clearance holes in the vacuum plate 602, and with an o-ring seal and vacuum grease (neither part is shown). The o-ring is fitted into a machine groove in the bottom vacuum housing 601 with tolerances typical for this type of vacuum connection, which will be well known to anyone skilled in the art of vacuum vessels or enclosures. The bottom vacuum housing 601 is also connected to the upper vacuum housing 603 via similar bolts, o-ring seals and vacuum grease with a similar groove for the o-ring. The upper vacuum housing 603 is connected to the adapter plate 604 in the same manner. The adapter plate 604 is connected to the cryo-cooler cold head 703 in the same manner, with a machined o-ring groove in the adapter plate 604, where the other side of the adapter plate 604 is made to accommodate the various choices of cryo-cooler heads that can be used where the bolt pattern has to match up with that supplied by the vendor of the coldhead.

The NTIS 1000 is designed to operate with a temperature gradient across it, so that some parts of the assembly are at room temperature (i.e., 300 K), and other parts at a cryogenic temperature (i.e., 4 K), and the gradient across the parts between them creates an effective mode of operation. The nested design takes the layers of a thermally insulating material or materials and "folds" them to create a compact stiff structure.

Figure 9:
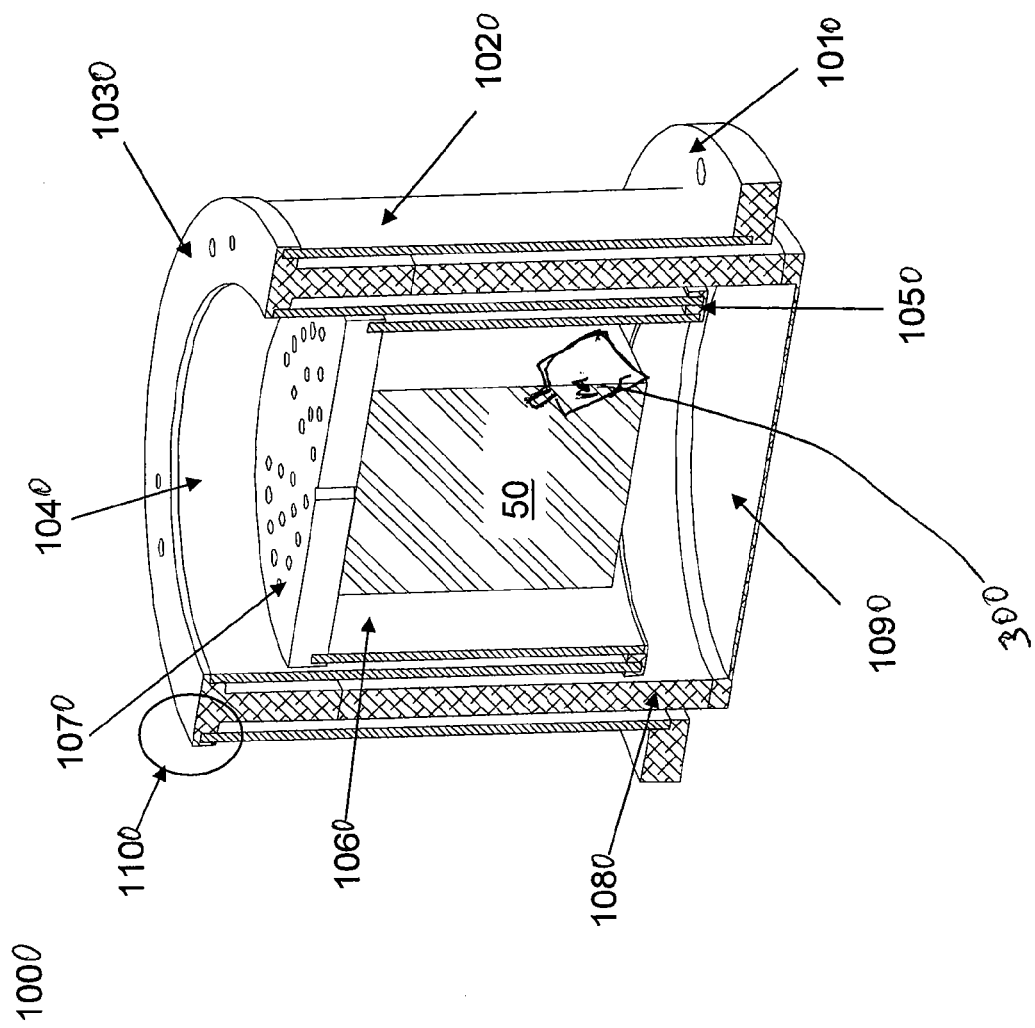
FIG. 9 is a cutaway view of a nested thermally insulating structure (NTIS) according to an embodiment of the present disclosure.

As is shown in FIG. 9, the radiation shield mount 1030 is connected to the middle thermally insulated tube 1040 via epoxy bonding, where the structure now goes back in the opposite direction, and in doing so, creates an insulating gap. The middle insulating tube part 1040 is connected to tube coupler 1050 via epoxy bonding. The tube coupler 1050 is then connected to the inner thermally insulated tube 1060 via epoxy bonding. The inner thermally insulated tube 1060 is formed in the opposite direction again, creating a second insulating gap, and then is connected to via epoxy bonding and supports the sample mount 1070. Sample mount 1070 at 4 K is connected via the low-temperature thermal link portion 802 to the low-temperature cold finger 703, which cools the plate (shown in FIG. 8B). A sample 50 can be mounted to sample mount 1070. The sample in this figure is connected to a motor 300. A radiation shield 1080 is used to minimize heat load between the outer and middle structure tubes 1040 and 1020. Radiation shield, also referred to as tubular radiation shield 1080, is at 40 K, and thus reduces heat from radiation. A further removable radiation shield cap 1090, at 40 K, is attached at the opening to the NTIS 1000 to block any radiation heat loads from the bottom.

The present disclosure can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the disclosure. However, it should be recognized that the present disclosure can be practiced without resorting to the details specifically set forth. In other instances, well known processing structures have not been described in detail, in order not to unnecessarily obscure the present disclosure.

Only a few examples of the present disclosure are shown and described herein. It is to be understood that the disclosure is capable of use in various other combinations and environments and is capable of changes or modifications within the scope of the inventive concepts as expressed herein.

The invention claimed is:

1. A method of rotating a sample for use in a cryocooler comprising:
    a) mounting a sample in a sample mounting apparatus, comprising a housing having an outer wall surface, an inner wall surface, a mount attached to the inner wall surface for supporting the sample, and a motor for rotating the sample;
    b) sealing the housing by applying a sealant to adjoining parts of the housing such that the joints between the parts do not allow gas to enter or leave the housing;
    c) evacuating the housing;
    d) adding an inert gas to the housing;
    e) sealing the inert gas in the housing;
    f) attaching the outer wall surface of the housing to a cryocooler; and
    g) rotating the sample by engaging the motor.

2. The method of claim 1, comprising sealing the housing joints with indium.

3. The method of claim 1, comprising sealing the housing joints with epoxy.

4. The method of claim 1, comprising sealing the housing joints with solder.

5. The sample mounting apparatus of claim 1, wherein the inert gas is helium.

6. The sample mounting apparatus of claim 1, wherein the inert gas is nitrogen.

7. The method of claim 1, comprising providing a transparent window portion for optical access to the sample.

8. The method of claim 7, comprising sealing the window portion to the housing with an indium seal.

9. The method of claim 7, comprising attaching the window portion to the housing with epoxy or glue, and providing a housekeeper seal in the housing to accommodate the differences in size of materials due to thermal expansion.

10. The method of claim 1, wherein said housing is comprised of copper.

11. The method of claim 1, wherein said motor is comprised of non-conducting materials or insulators for the purpose of dissipating eddy currents.

12. The method of claim 1, wherein said motor is comprised of non-magnetic materials.

13. The method of claim 12, wherein said motor is comprised of aluminum.

14. A cryogenic apparatus comprising:
    a sample holder;
    a cryo-cooler;
    a thermal link connecting the sample holder and the cryo-cooler; and
    a motor attached to the sample holder for rotating a sample.

15. The cryogenic apparatus of claim 14, wherein the cryo-cooler can be replaced with an open-cycle cryostst.

16. The cryogenic apparatus of claim 14, wherein the structure comprises a nested thermally insulated structure.

* * * * *